(12) United States Patent
Amsden et al.

(10) Patent No.: US 7,918,954 B2
(45) Date of Patent: Apr. 5, 2011

(54) METHOD AND APPARATUS FOR SEALING A GLASS PACKAGE

(75) Inventors: Jeffrey Michael Amsden, Hammondsport, NY (US); James Joseph Bernas, Horseheads, NY (US); John Joseph Costello, III, Lake Elmo, MN (US); Margaret Helen Gentile, Boston, MA (US); Mark Andrew Stocker, Market Harborough (GB); Lu Zhang, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 191 days.

(21) Appl. No.: 12/245,832

(22) Filed: Oct. 6, 2008

(65) Prior Publication Data
US 2009/0133807 A1    May 28, 2009

Related U.S. Application Data

(60) Provisional application No. 60/997,817, filed on Oct. 5, 2007.

(51) Int. Cl.
| | |
|---|---|
| *C03C 27/00* | (2006.01) |
| *C03C 27/06* | (2006.01) |
| *B32B 17/00* | (2006.01) |
| *B32B 37/00* | (2006.01) |
| *B32B 37/10* | (2006.01) |

(52) U.S. Cl. ............... 156/105; 156/272.2; 156/272.8; 156/285; 156/379.6; 156/497

(58) Field of Classification Search ............... 156/105, 156/145, 272.2, 272.8, 285, 292, 497; 65/36–59.7
See application file for complete search history.

(56) References Cited

U.S. PATENT DOCUMENTS

| | | | |
|---|---|---|---|
| 6,998,776 B2 * | 2/2006 | Aitken et al. | 313/512 |
| 2003/0020181 A1 | 1/2003 | Yamada | 257/787 |
| 2005/0217319 A1 * | 10/2005 | Yoshizawa | 65/34 |
| 2007/0176551 A1 | 8/2007 | Kwak | 313/512 |

* cited by examiner

*Primary Examiner* — Khanh Nguyen
*Assistant Examiner* — Carson Gross
(74) *Attorney, Agent, or Firm* — Kevin M. Able

(57) ABSTRACT

An apparatus for sealing a substrate assembly by applying a force to the assembly while simultaneously exposing the substrate assembly, and in particular a sealing material disposed between two substrates of the substrate assembly, to an irradiating beam of electromagnetic energy. The beam heats, cures and/or melts the sealing material, depending upon the sealing material to form the seal. The force is applied by directing a flow of fluid against the substrate assembly, and beneficially improves contact between the substrates of the substrate assembly and the sealing material during the sealing process, therefore assisting in achieving a hermetic seal between the substrates.

8 Claims, 6 Drawing Sheets

METHOD AND APPARATUS FOR SEALING A GLASS PACKAGE

This application claims the benefit of priority under 35 U.S.C. §119(e) of U.S. Provisional Application No. 60/997,817 filed Oct. 5, 2007. the content of which is relied upon and incorporated herein in its entirety.

BACKGROUND

1. Field of the Invention

This invention relates to a method and an apparatus for forming a glass package, and in particular for sealing a glass assembly comprising an organic light emitting diode display device by irradiating the glass assembly with electromagnetic energy.

2. Technical Background

Flat panel display devices, such as liquid crystal and plasma display devices for use in televisions, continue to replace cathode ray tube display devices as the display of choice for a broad array of applications, from cell phones to televisions.

More recently, organic light emitting diode (OLED) display devices have made progress in the market place. Unlike LCD displays, which utilize a liquid crystal layer to alternately pass and block a light source, and plasma displays which emit light from a charged gas, OLED displays utilize an essentially solid state array of organic light emitting diode devices to generate light, each organic light emitting diode comprising one or more layers of an organic material sandwiched between electrodes, typically an anode and a cathode, as well as ancillary electronic circuitry to control the emission state of the diode.

OLED display devices advantageously comprise a thin form factor, low power consumption, a wide color gamut, a high contrast ratio fast response time and a lower temperature manufacturing process compared to, for example, LCD display technologies.

In spite of the foregoing advantages, the one or more organic layers comprising each OLED is susceptible to degradation in the presence of oxygen and/or moisture. Therefore, great effort is made to provide a hermetic package to contain the OLED devices.

Prior art displays have used adhesive-based seals, typically between thin glass substrates. However, adhesives, such as various epoxies, tend to have unacceptable leakage rates for long device life, thereby requiring a desiccant to be disposed within the sealed glass package to absorb moisture and/or various gases which may penetrate the seal, or which may be generated during curing of the adhesive seal.

More recently, frit sealing of the glass package has become a practical alternative. In frit sealing, a glass frit is deposited between the two glass substrates. The glass frit is heated to soften or melt the frit, thereby forming a hermetic seal between the substrates. Because the organic material comprising the OLED will degrade at temperatures that exceed about 100° C., the heating must be localized, and is typically done using a laser or by masking a broad heat source, such as an infrared lamp.

To ensure a good frit seal, such factors as the expansion compatibility of the frit and the substrates, the speed of the laser, the laser power, and the absorption characteristics of the frit and substrates should be considered. A further consideration is the quality of the contact between the frit and the substrates during the sealing process, which can be impacted by the amount of force applied to one or both of the substrates during the sealing process. In the simplest process, the weight of the top substrate applies a given force against the sealing material. However, the weight of the substrate in and of itself is insufficient for facilitating a good seal. Simply placing the aligned sheets of glass beneath the laser and sealing with the laser will produce a seal, but one that may have narrow patches as well as delamination defects, which are both caused by irregularities in the dispensed sealing material (e.g. frit). These artifacts of the sealing process may have a severely detrimental effect on the life and performance of an OLED device disposed between the substrates. Applying force during the sealing process minimizes these defects, as well as increases the overall seal width. Consequently, alternative methods for applying a force to the top substrate are needed.

SUMMARY

An apparatus and method are disclosed that can improve the seal quality of a glass package, and in particular a glass package comprising one or more organic light emitting diode devices. In one broad aspect the present invention is used to apply a force against an assembly comprising first and second glass substrates, and including a sealing material disposed therebetween. Simultaneous with the application of the force, a beam of electromagnetic energy is used to irradiate the sealing material, thereby connecting the first substrate to the second substrate according to the nature of the sealing material. For example, if the sealing material is an adhesive, such as an epoxy adhesive, the incident energy beam may cure the adhesive. If the sealing material is a glass-based frit, the energy beam can be used to heat and soften the frit to form the seal. Both the energy beam and the applied force are traversed over the length of the sealing material to form a sealed glass package. Preferably, the glass package is hermetically sealed such that oxygen and/or water do not penetrate the seal at more than about $10^{-3}$ cc/m$^2$/day and/or $10^{-6}$ g/m$^2$/day, respectively. Thus, the life of an organic light emitting diode (OLED) device that may be disposed between the first and second substrates and encircled by the sealing material may advantageously be extended.

The force is applied by a fluid bearing element that applies a force against the glass assembly without contacting the assembly. Preferably, the force is applied against the assembly in proximity to the point on the assembly at which the energy beam impinges. That is, it is preferably that the fluid bearing element or elements generally encircle the point at which the beam impinges the assembly so that the force is relatively uniformly applied to the substrate(s) and transmitted to the sealing material. Thus, contact between the sealing material and the substrates can be improved by causing the sealing material to spread against the substrates. Moreover, the force applied by the method and apparatus disclosed herein can mitigate against unevenness in the height of the sealing material above the substrate on which the sealing material may be dispensed. This unevenness can result in a poor seal between the substrates.

In some embodiments, the radiation source is slidably connected to a housing, such as through a collet, the position of the housing thus being adjustable relative to the irradiation source.

In accordance with an embodiment of the present invention, a method for sealing a glass package is disclosed comprising providing an assembly comprising first and second glass substrates and a sealing material disposed between the first and second substrates, directing a fluid against the assembly to apply a predetermined force against the assembly, irradiating the sealing material with an irradiation source; and translating the force and the irradiation source over the sealing material in unison during the irradiating, thereby forming a seal between the first and second substrates.

In another embodiment, an apparatus for sealing a glass assembly is described comprising a housing, a gas ejector for directing a flow of gas against the glass assembly, thereby applying a sealing force against the assembly, a positioning system for translating the housing relative to the glass assembly, and an irradiation source coupled to the housing and that translates in unison with the housing to irradiate the sealing material and seal the assembly.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate an exemplary embodiment of the invention and, together with the description, serve to explain the principles and operations of the invention.

DETAILED DESCRIPTION

Figure 1:
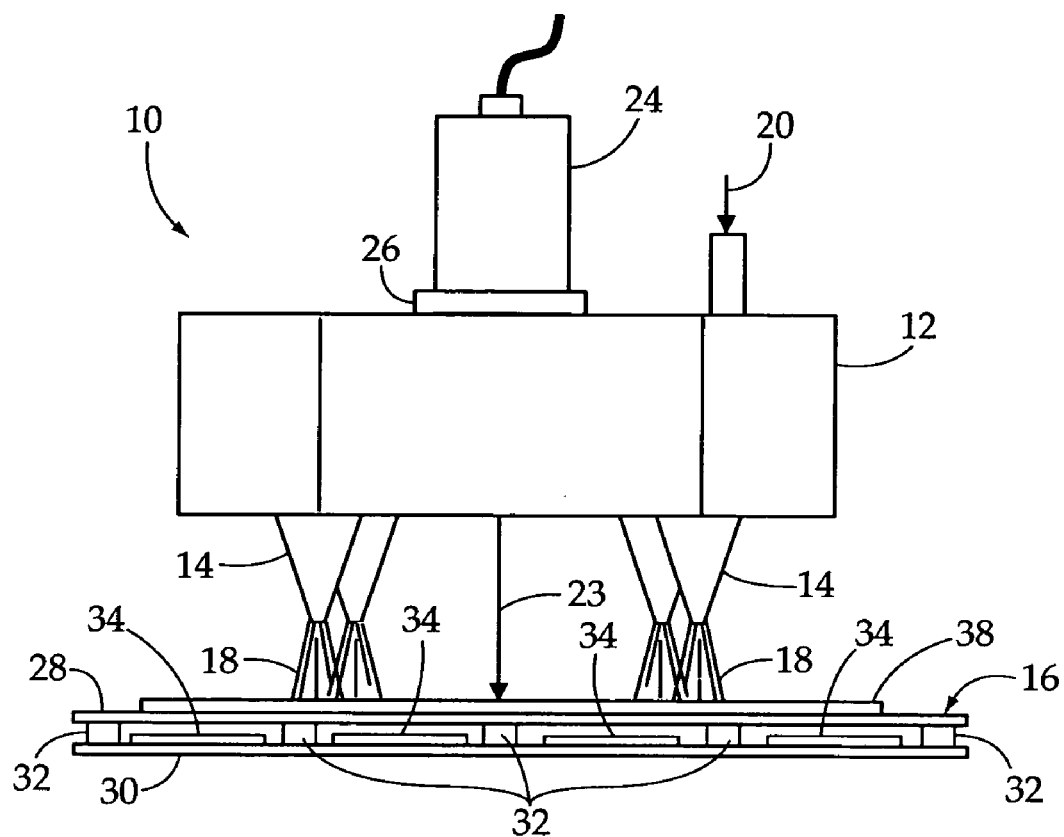
FIG. 1 is a front elevation view of a sealing apparatus for sealing a glass package according to an embodiment of the present invention.

In the following detailed description, for purposes of explanation and not limitation, example embodiments disclosing specific details are set forth to provide a thorough understanding of the present invention. However, it will be apparent to one having ordinary skill in the art, having had the benefit of the present disclosure, that the present invention may be practiced in other embodiments that depart from the specific details disclosed herein. Moreover, descriptions of well-known devices, methods and materials may be omitted so as not to obscure the description of the present invention. Finally, wherever applicable, like reference numerals refer to like elements.

Figure 2:
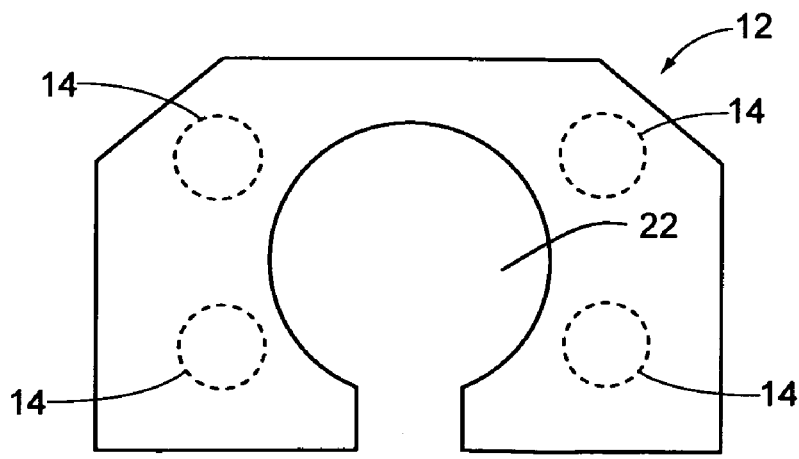
FIG. 2 is a top view of a housing defining a passage for disposing an irradiation source and through which a beam of energy is directed through according to the apparatus of FIG. 1.

Shown in FIGS. 1 and 2 is an embodiment of an apparatus 10 for sealing glass substrate assemblies by applying a localized force against the substrate assembly while simultaneously exposing the substrate assembly to a beam of electromagnetic energy that seals the substrate assembly to form a glass package by curing, or softening, a sealing material. The glass package may be, for example, an OLED display. The sealing force is applied to the substrate assembly without contacting the assembly with the apparatus. The application of a force to the assembly is beneficial in facilitating an appropriate seal, and is particularly useful for forming a hermetic seal in an OLED display assembly. Preferably, the force is applied proximate the point at which the beam of energy irradiates the substrate assembly, and is capable of being moved in unison with the beam as the beam traverses the sealing material. As used herein, a hermetic seal is defined as a seal that provides a barrier for oxygen wherein no more than about $10^{-3}$ cc/m$^2$/day of oxygen can penetrate through the seal and a barrier for water wherein no more than about $10^{-6}$ g/m$^2$/day of water can penetrate through the seal.

As shown in FIG. 1, apparatus 10 comprises housing block 12 and a plurality of nozzles 14 extending from housing block 12 for applying a force against a surface of substrate assembly 16 via jets 18 of a fluid issuing from nozzles 14. Preferably the fluid is a compressible fluid such as gas (e.g. air) that is supplied to the nozzles under pressure. For example, in some embodiments the gas may be air, or be comprised substantially of an inert gas such as nitrogen. Preferably the gas is clean and dry. Nozzles 14 are in fluid communication with a supply of fluid, represented by arrow 20, such as a conventional gas delivery system (e.g. compressor, bottled gas, etc.). The gas delivery system may include associated piping and valves, pressure regulators, flow meters, dryers or other commonly employed devices for ensuring consistent delivery of a clean, dry gas.

Referring to FIGS. 1-2, housing block 12 may further define a passage or channel 22 (shown in FIG. 2) that provides a pathway for a beam of electromagnetic energy 23 emitted by irradiation source 24, thereby allowing the beam to pass unobstructed through housing block 12. Irradiation source 24 may be mounted on or within housing block 12 such that the irradiating beam emitted by irradiation source 24 moves in unison with housing block 12 and thus with the fluid jets emitted by nozzles 14. Alternatively, irradiation source 24 may be separately mounted on a device (not shown), such as a gantry or rail system adapted to move irradiation source 24 in unison with housing block 12. Such movement in unison can be accomplished by computer control of both the irradiation source and housing block 12. Preferably, irradiation source 24 is mounted within housing block 12 and adapted such that housing block 12 is translatable with respect to irradiation source 24. For example, apparatus 10 may further comprise collet 26 for mounting radiation source 24, collet 26 being adapted to fit and be translatable (e.g. slidable) within passage 22. Collet 26 may be further adapted to be mounted to a stage capable of movement along two orthogonal axes parallel with the substrate assembly to be sealed. Housing block 12 may then be moved relative to collet 26 to adjust a vertical height of housing block 12 (and nozzles 14) above substrate assembly 16, while the stage provides movement of housing block 12 in a plane parallel with substrate assembly 16.

Substrate assembly 16 comprises first substrate 28, second substrate 30, and a sealing material 32 disposed between the first and second substrates. Preferably, first and second substrates 28, 30 are flat glass sheets, such as glass sheets suitable for use in the manufacture of flat panel displays (e.g. OLED displays). Such glass substrates are thin, having a thickness typically less than about 1 mm, and in some embodiments a thickness less than about 0.7 mm. Exemplary glass sheets are those manufactured and sold by Corning Incorporated as code 1737, 1737F, Eagle2000™ or Eagle XG™. Substrate assembly 16 may also include one or more organic light emitting diode (OLED) devices 34 comprising one or more layers of an organic material, as well as associated electrical and/or electronic components, such as one or more electrodes connected with OLED device 34, and thin film transistors (TFTs).

Although sealing material 32 may be any sealing material suitable for sealing flat panel display substrates, such as, for example, a radiation-curable adhesive (e.g. epoxy), sealing material 32 is preferably a glass-based frit. The frit may be a powder or a paste, but is more often a paste formed from glass powders mixed with organic binders and a solvent or carrier. In some embodiments, the frit is deposited on first substrate 28 as a paste in a predetermined pattern and then sintered by heating the frit and/or substrate to retain the frit on the substrate prior to bringing the first and second substrates together to form assembly 16. The frit may also include an inert filler material for raising, but more often lowering, a coefficient of thermal expansion (CTE) of the frit. Suitable inert fillers include beta eucryptite. To ensure sealing material 32 (e.g. frit 32) is capable of forming a robust seal between the substrates, the coefficient of thermal expansion (CTE) of the sealing material should substantially match the CTEs of the first and second substrates. Preferably, a thermal expansion mismatch between substrates 28, 30 and sealing material 32 is less than about 350 ppm at 125° C., or a room temperature mismatch less than about 125 ppm at room temperature.

Because sealing material 32 is sealed by irradiating the sealing material with a beam of electromagnetic energy (e.g. light), sealing material 32 should substantially absorb energy at a wavelength emitted by irradiation source 24, such that the absorbed energy is converted to heat that cures, softens or melts the sealing material (depending upon the characteristics of the particular sealing material chosen), thereby forming a seal extending between the first and second substrates. Preferably the seal thus formed is a hermetic seal. This is particularly true if substrate assembly 16 includes one or more OLED devices, as contact between such devices and oxygen and/or moisture may substantially degrade the performance of the OLED devices, even after a relatively short exposure time.

If sealing material 32 is a glass frit, absorption of energy by the frit may be enhanced by doping the frit with one or more elements from the transition metal or lanthanide groups. Suitable transition metals include, for example, iron, vanadium or copper. An example of a suitable lanthanide is neodymium. Preferably, the first and second substrates do not absorb an appreciable amount of energy at the wavelength or range of wavelengths emitted by irradiation source 24, typically in a wavelength range between about 800 nm and 1500 nm. That is, the first and second substrates are preferably transparent or substantially transparent at the wavelength or range of wavelengths emitted by the irradiation source. In this way, the frit can be irradiated through the first or second substrate without substantial heating of the substrates. The frit absorbs a substantial portion of the energy, and is thereby heated to at least a softening point of the frit, thereby forming a seal between the first and second substrates when the frit solidifies. The frit preferably absorbs at least about 65% of the energy incident on the frit.

Irradiation source 24 may be any source suitable for irradiating sealing material 32 and forming a seal between the first and second substrates, such as an infrared lamp for example. However, irradiation source 24 is typically a laser that emits a high power density coherent beam of light. Preferably the light has a wavelength in the infrared wavelength range. If the sealing material is an epoxy adhesive, the irradiation source may emit at ultraviolet wavelengths: the choice of laser and the emission wavelength or range of wavelengths is selected to correspond with the sealing requirements of the sealing material. For instances where sealing material 32 is a glass-based frit, choices of lasers may include Ytterbium (900 nm<$\lambda$<1200 nm), Nd:YAG ($\lambda$=1064 nm), Nd:YALO ($\lambda$=1.08 $\mu$m), erbium ($\lambda \approx 1.5$ $\mu$m) and $CO_2$ lasers. Other irradiation sources, such as microwave sources, are also contemplated, depending upon the specific sealing material. That is to say, the emitting source should be compatible with the sealing material and the article or articles to be sealed. Preferably, the sealing material has a high energy absorption within a wavelength range of the irradiation source.

An optional mask 38 may be disposed over substrate assembly 16 to ensure that the beam of electromagnetic energy is directed only to the sealing material and not to other components that may be on or in the assembly that may be damaged by exposure to the beam. Mask 38 may be, for example, a glass plate having a masking material disposed on the plate (e.g. an aluminum film) so that much of the surface of the glass plate is opaque to the sealing radiation, with the exception of transparent pathways corresponding to the sealing material pattern positioned between substrates 28, 30. Thus, sensitive organic material that may be disposed between substrates 28, 30 can be protected from the irradiating beam. For example, typical organic materials associated with OLED devices must not be heated in excess of 100° C., or degradation of the material may occur. Mask 38 is particularly useful in the event irradiation source 24 is a broad-beam source such as an incoherent infrared lamp that has a beam diameter much larger than the width of an individual line of frit.

Figure 3A:
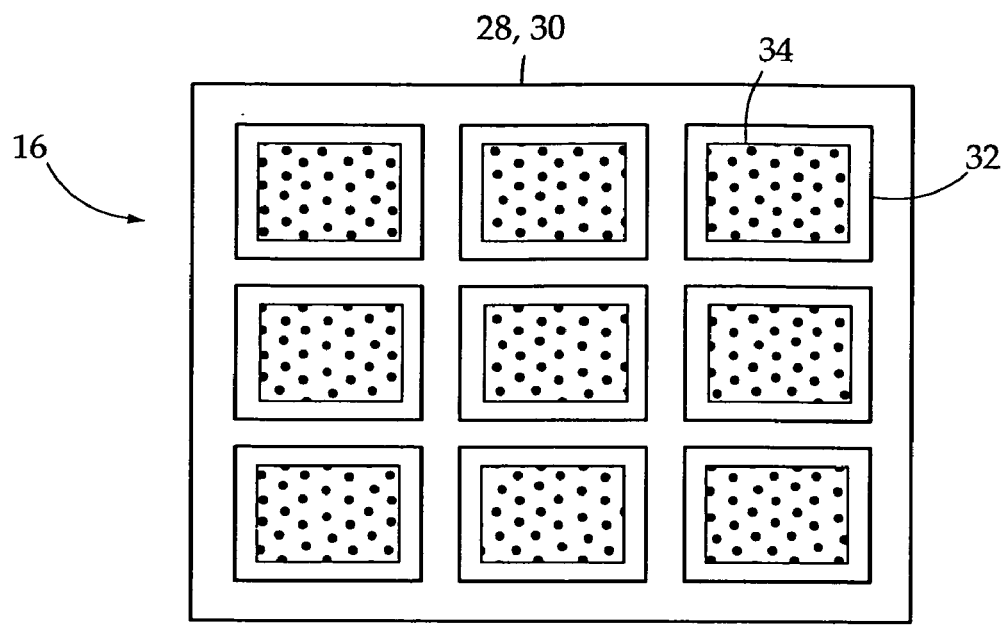
FIG. 3A is a top view of a glass assembly showing patterns of sealing material and OLED devices disposed within the patterns of sealing material.
Figure 3B:
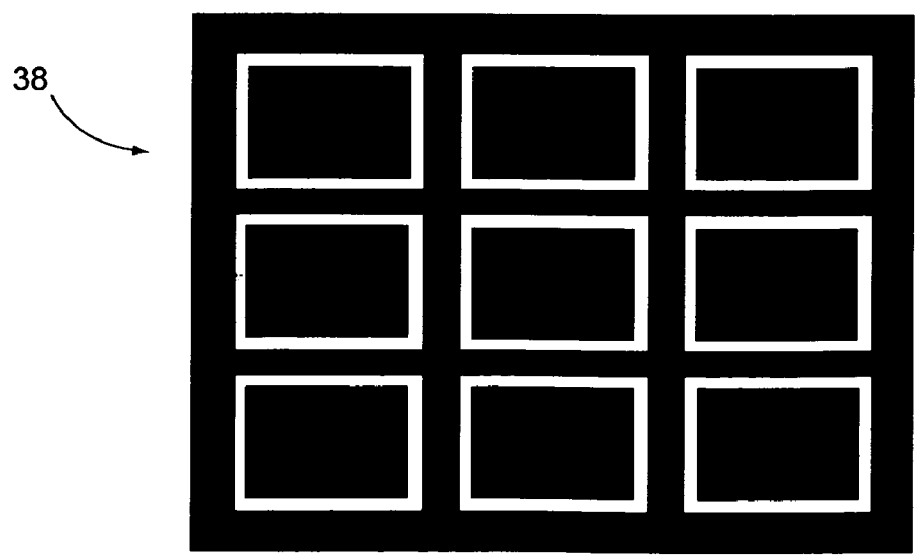
FIG. 3B is a top view of an optional mask that can be used to shield the OLED devices of FIG. 3A against stray energy during the sealing process.

Shown in FIG. 3A is a top down view of substrate assembly 16 illustrating first and second substrates 28, 30, and sealing material 32. A plurality of OLED devices 34 are also shown. Sealing material 32 is positioned between substrates 28, 30 and arranged as a plurality of substantially rectangular "frames" that encircle each OLED device. FIG. 3B depicts a mask 38 wherein the black portions of the mask represent areas that are opaque to the irradiating beam of energy, whereas the "clear" (white) portions are transparent to the irradiating beam of energy. When the mask is properly positioned with respect to assembly 16, the transparent areas of the mask correspond to and are aligned with the sealing material "frames".

Figure 4A:
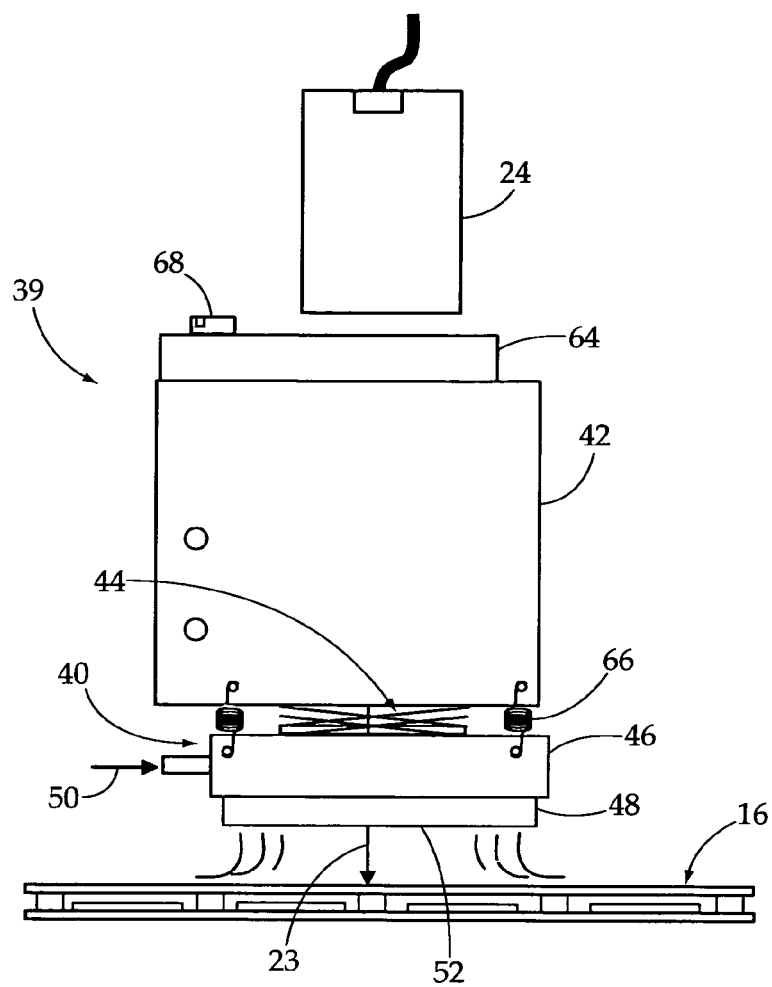
FIG. 4A is a side elevation view of another embodiment of a sealing apparatus according to the present invention wherein a fluid is ejected through a porous member against the glass assembly of FIG. 3A.
Figure 4B:
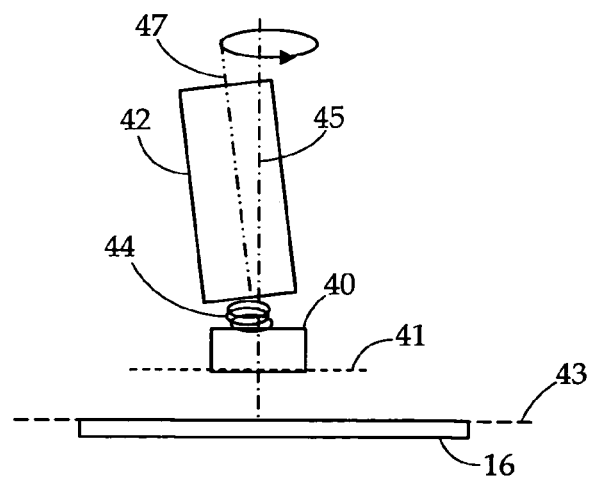
FIG. 4B is a diagrammatic illustration showing an exemplary head element in a tilted orientation.
Figure 5:
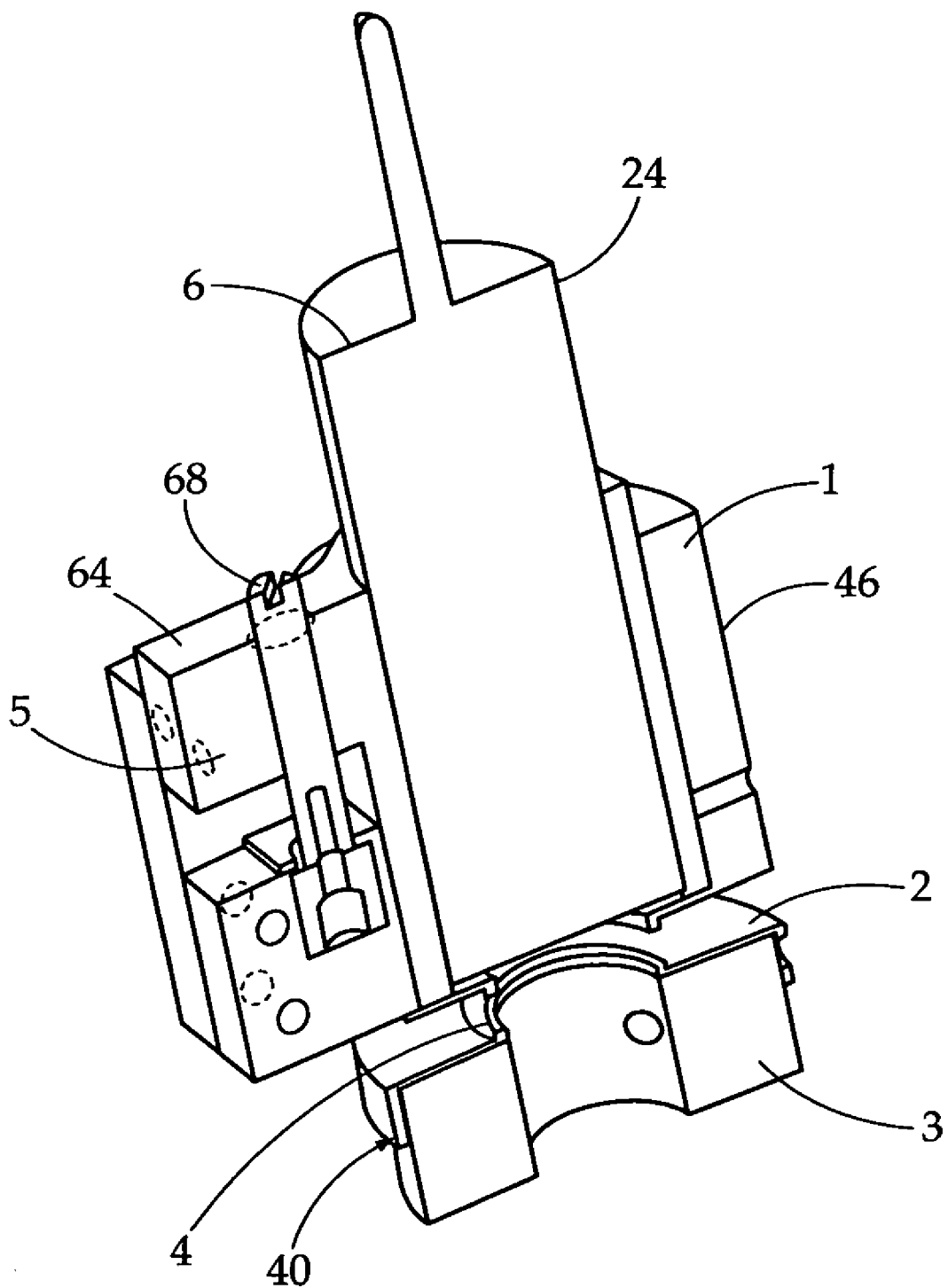
FIG. 5 is a cutaway view of the sealing apparatus of FIG. 4.

In another embodiment illustrated in FIG. 4-5, apparatus 39 for sealing a glass package is illustrated, wherein a fluid is discharged from a porous member of the apparatus, thereby exerting a force against assembly 16. The present embodiment has similarity with the previous embodiment in that the present embodiment utilizes a housing block and a collet slidably disposed within a passage in the housing block. The collet is adapted to hold a radiation source. However, unlike the previous embodiment, the present embodiment uses a porous medium, such as graphite, through which a fluid (e.g. gas) is expelled to apply a force against substrate assembly 16.

As shown in FIG. 4A, head assembly 40 is movably attached to housing block 42 via flexible support member 44. Flexible support member 44 may be, for example, a "wave spring" such as is available from Smalley Steel Ring company, Lake Zurich, Ill. The function of flexible member 44 is to provide tilt capability to head assembly 40 such that the head assembly may be tilted relative to the housing block and the substrate assembly. Preferably, head assembly 40 may be tilted through 360°. The ability to tilt provides that a reference surface (dotted line 41 in FIG. 4B) of the head assembly may be maintained parallel with a reference surface (dotted line 43 in FIG. 4B) of substrate assembly 16 as apparatus 39 is traversed over substrate assembly 16. To wit, head assembly 40 is self-leveling (head assembly 40 is shown tilted relative to housing 42, but parallel with substrate assembly 16 in FIG. 4B). For example, the reference surface 41 of head assembly 16 may be maintained a scant 50 μm away from the reference surface 43 of substrate assembly 16, and contact between the head assembly and substrate assembly 16 may irreparably damage the substrate assembly. Thus, the head assembly should be able to accommodate misalignment of the housing relative to substrate assembly 16, or non-flatness of the substrate assembly or any of its components. Viewed in a different way and illustrated in FIG. 4B, a misaligned housing 42 having a longitudinal axis 45 should be capable of "precessing" through an angle of 360° about the axis 47 normal to both substrate assembly reference surface 43 and head assembly reference surface 41.

Flexible member 44 preferably also performs a loading function in that when compressed in one direction, flexible member 44 provides a restoring force in the opposite direction. Thus, when head assembly 40 is positioned close to substrate assembly 16, the fluid emitted by head assembly tends to push the head assembly away from the surface of the substrate assembly, while the restoring force of flexible member 44 works to restore the position of the head assembly. This contributes to the downward force on the substrate assembly. The restoring force provided by flexible member 44 is a function, inter alia, of the air pressure/flow supplied by the head assembly, and the distance between the head assembly and the substrate assembly.

Figure 6:
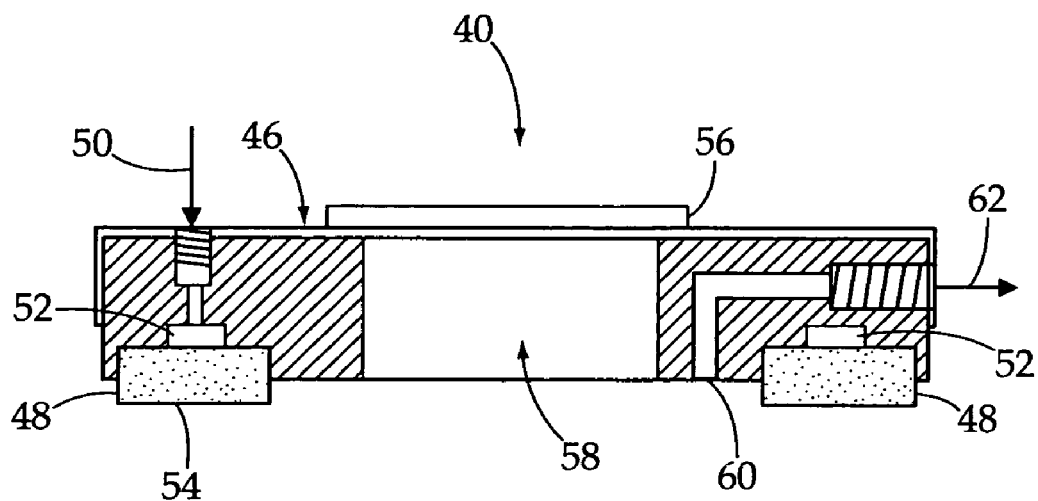
FIG. 6 is a cross sectional view of a head assembly of the sealing apparatus of FIG. 4.
Figure 7:
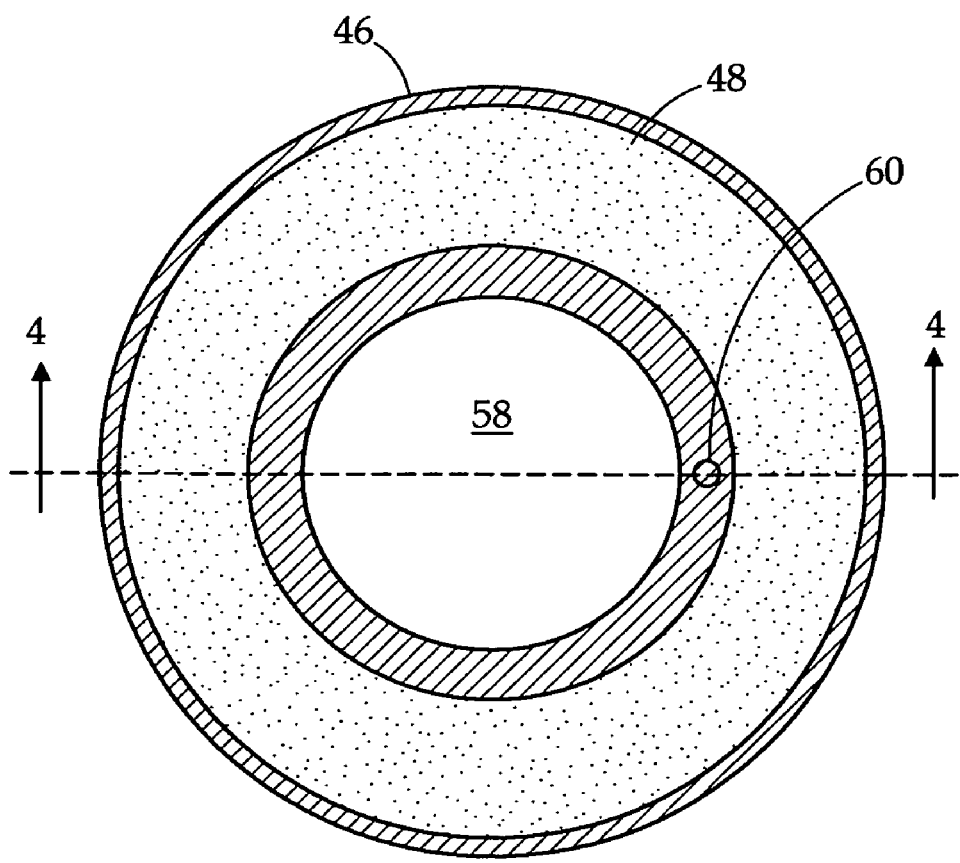
FIG. 7 is a bottom view of the head assembly of FIG. 6.

Referring to FIGS. 6-7, head assembly 40 comprises body member 46. Body member 46 further includes a porous member 48 disposed in a bottom surface of body member 46. Porous member 48 may be formed from graphite, or any other suitable porous material that allows the working fluid to be expelled in a highly diffused manner through the porous material. For example, porous member 48 may be a sintered powered metal material (e.g. sintered bronze). Porous member 48 is in fluid communication with a suitable fluid delivery system, whereby the fluid such as a gas (e.g. air) may be delivered to head assembly 40 as represented by arrow 50, and to porous member 48 through interior plenum 52, and expelled through bottom surface 54 of porous member 48. A conventional gas delivery system such as previously described may be used. Bottom surface 54 may be selected as the head assembly reference surface, whereas the upper surface of first substrate 28 (surface closest to head assembly 40) may be selected as the reference surface of substrate assembly 16. Flange 56 is coupled to body member 46 and serves to orient and retain flexible member 44.

Head assembly 40 is annular, having a central passage 58 through which irradiating beam 23 from irradiation source 24 may pass. Head assembly 40 may optionally further comprise a vacuum port 60 through which the fluid expelled through porous member 48 may be evacuated, as indicated by arrow 62, by a suitable vacuum system (e.g. vacuum pump).

To prevent unwanted vertical displacement of head assembly 40 from housing 42, such as when head assembly 40 is lifted away from the substrate assembly 16, head assembly 40 may be further coupled to housing 42 via coupling members 66. For example, coupling members 66 may be in the form of small coil springs that connect head assembly 40 to housing 42. However, other methods of coupling may be employed, such as straps that limit separation of the head assembly relative to housing 42.

Irradiation source 24 is mounted to collet 64, and collet 64 is slidable within housing 42. Any suitable method of translating collet 64 within housing 42 may be used. For example, collet 64 and housing 42 may be connected through a conventional rack and pinion assembly, or may be adjusted via adjustment screw 68.

Again, similar to the previous embodiment, when collet 64 is mounted to a suitable frame, housing 42, and thereby head assembly 40, may be translated vertically relative to collet 64. That is, head assembly 40 may be moved closer to or farther from substrate assembly 16 by translating housing 42 relative to collet 64. More specifically, by translating housing 42 and therefore head assembly 40 vertically relative to collet 64, the reference surface of head assembly 40, i.e. surface 54 of porous member 48, can be made to move closer to or farther from the reference surface of substrate assembly 16 (the top surface of first substrate 28). For a given set of fluid delivery parameters—for example, a given gas delivery pressure—moving head assembly 40 closer to substrate assembly 16 has the effect of increasing the force against substrate assembly 16 (e.g first substrate 28), while moving head assembly 40 away from substrate assembly 16 has the effect of decreasing the force applied against substrate assembly 16 (e.g. first substrate 28).

Figure 8:
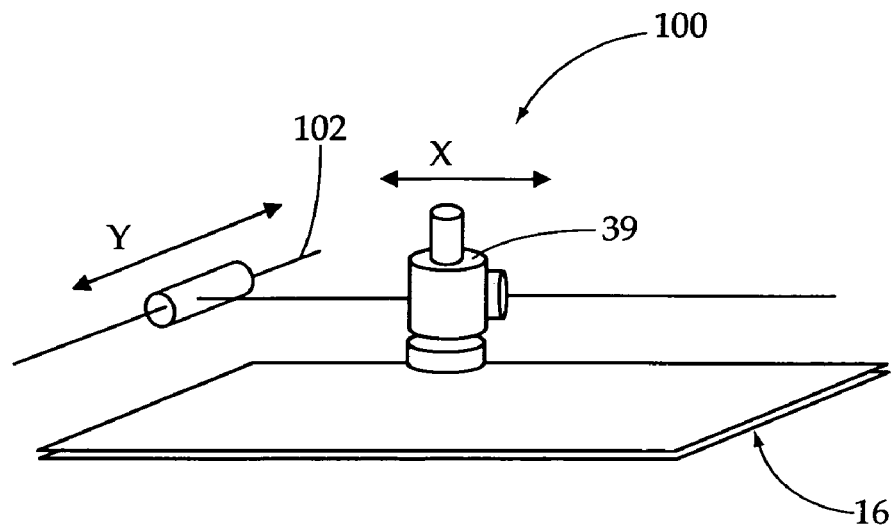
FIG. 8 is a diagrammatic view in perspective of an XY positioning system for use with embodiments of the present invention.

In one embodiment, best shown in FIG. 8, a sealing apparatus of the present invention (14 or 42), including irradiation source 24, may be mounted on an XY positioning system 100 (including rail or gantry system 102, linear motors/actuators, translation stages, position sensors and so forth) over substrate assembly 16 such that the housing and irradiation source 24 may be moved to any location over substrate assembly 16. Such positioning systems are well known in the art and will not be described further. Preferably, positioning system 100 includes a computer for controlling the movement of the rail system such that housing 14, and thus irradiation source 24, may be automatically positioned and translated with respect to substrate assembly 16. The energy beam emitted by the irradiation source may then irradiate the sealing material and seal the substrates of the substrate assembly to form a glass package according to pre-programmed instructions contained in the computer. Thus, irradiation source 24 (and the beam of energy emitted from irradiation source 24) may be translated over and around each sealing material pattern to form a seal between the first and second substrates. Once the substrates have been sealed, the individual OLED displays are separated from the substrate assembly, and thereafter used in the manufacturing of a particular device (e.g. cell phone, camera, etc.).

Figure 9:
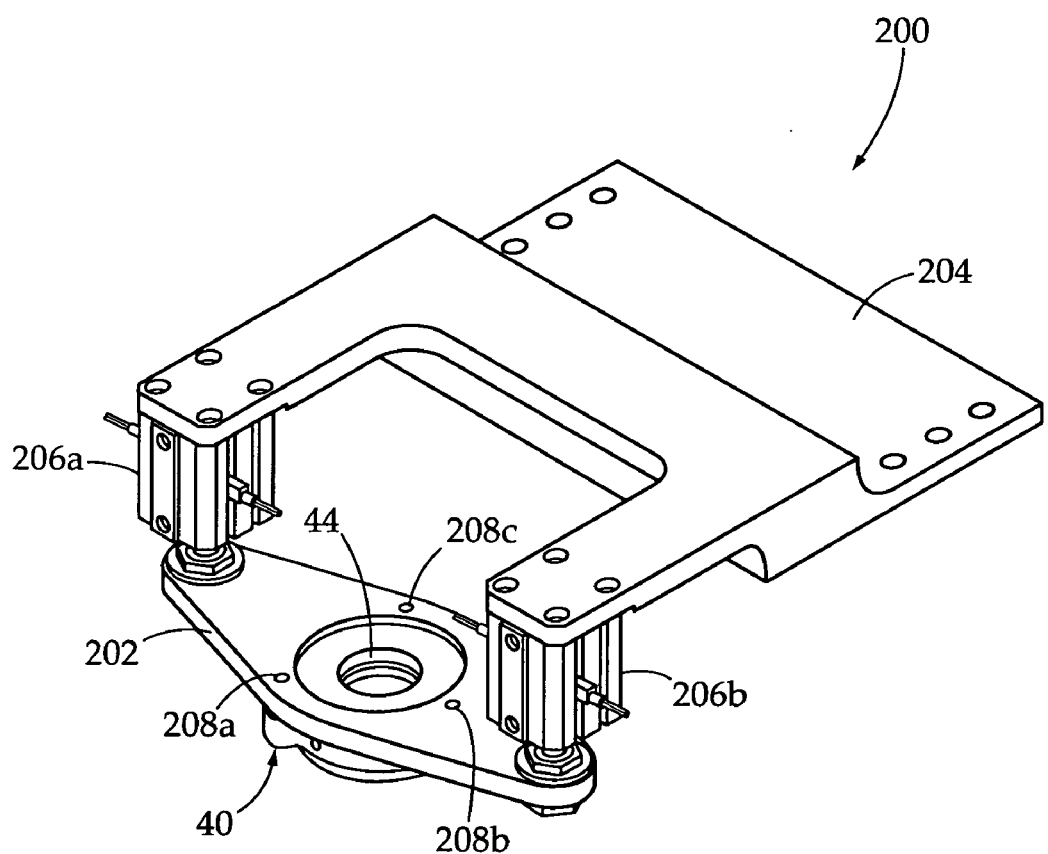
FIG. 9 is a perspective view of another embodiment of a sealing apparatus according to the present invention.

In still another embodiment shown in FIG. 9, housing 42 and collet 64 have been eliminated from apparatus 39. As illustrated in FIG. 9, apparatus 200 comprises head assembly 40, including porous member 48, and flexible member 44 that couples head assembly 40 to bracket 202. Bracket 202 is attached to bracket 204 through air piston assemblies 206a and 206b. Air piston assemblies 206a,b are connected to an air supply suitable for extending and retracting the pistons. Instead of small springs as described for apparatus 39, apparatus 200 employs pins or shafts 208a,b,c (coupling members) extending between head assembly 40 and bracket 202 to stabilize head assembly 40 relative to bracket 202 and to limit the separation distance between head assembly 40 and bracket 202. In operation, bracket 204 is attached to a Z-stage component of positioning system 100 (not shown) that controls the vertical movement of apparatus 200 relative to substrate assembly 16. Irradiation source 24 may also be attached to the Z-stage component to allow apparatus 200 and irradiation source 24 to move in unison during the sealing process. As before, the beam of electromagnetic energy emitted by the irradiation source 24 is positioned such that the beam passes through the central cavity of the annular head assembly. Thus, the beam is circumscribed by the force applied by the fluid emitted from the porous member of the head assembly. This ensures an even distribution of force about the point on the substrate assembly where the beam is incident, thereby helping to optimize the seal formed between first and second substrates 28, 30.

Examples

In one experiment, four Exair model # 1009 air nozzles were disposed in a radially symmetric pattern around a laser that was itself disposed in an aluminum housing and mounted such that the direction of airflow was perpendicular to the upper glass substrate surface of a glass assembly as previously described. The housing included four press-fit air hose connectors for ½" OD hose with which to supply the nozzles with compressed air. The hose was connected to a compressed air feed with a regulator to adjust the pressure and fine tune it to the desired amount. The air jet assembly (housing and nozzles) was slipped over the laser collet and screwed into place. The sealing height (from the surface of the glass to the bottom edge of the laser) was approximately 26 mm, with the tips of the nozzles positioned about 10 mm below the laser (about 16 mm from the glass).

The air nozzles were adjustable to different flow outputs, and thus different forces. In this experiment they were operated with 80 PSI of input pressure, approximately 13 standard cubic feet per minute of air used per nozzle, and a force output of about 12 ounces at each nozzle measured one foot from the nozzle tip. The relationship between pressure input and force output is a linear one, and the air pattern generated by the nozzles was a cone shape whose base area increased with distance.

During operation, the glass substrates that comprised the glass assembly were laid on a table. A temporary sealant was applied to the peripheral edge of the assembly to keep out air exiting the nozzles and to hold down the glass during sealing. It was found that if sheet is left unsecured during the sealing operation, the force of the air may cause the edges of the sheet to lift, thereby disrupting alignment of the OLED devices relative to the frit. During initial trials, the glass was taped to the sealing table with plastic tape. In a factory setting, a 'picture frame gasket' could be used, consisting of a metal frame with a silicon o-ring that sits around the edge of the glass. This would be placed on top of the layers of glass prior to sealing. The O-ring would provide a seal to block the air, and the weight of the frame itself would keep the glass from being lifted. Seal widths of 83% were attained with the apparatus, wherein the seal width is defined as the ratio of the sealing material width (e.g. the width of a bead of sealing material) to the width of the contact between the sealing material and the second substrate.

It should be emphasized that the above-described embodiments of the present invention, particularly any "preferred" embodiments, are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

What is claimed is:

1. A method for sealing a glass package comprising:
providing an assembly comprising first and second glass substrates and a sealing material disposed between the first and second substrates;
directing a fluid against the assembly to apply a predetermined force against the assembly;
irradiating the sealing material with an irradiation source;
translating the force and the irradiation source over the sealing material in unison during the irradiating, thereby forming a seal between the first and second substrates; and
wherein the applied force circumscribes a beam of electromagnetic energy emitted by the irradiation source.

2. The method according to claim 1 wherein the sealing material is a glass-based fit, and the irradiating heats and softens the glass-based fit to form the seal.

3. The method according to claim 1 wherein the irradiation source emits a light in the infrared or ultraviolet wavelength range.

4. The method according to claim 1 wherein the irradiation source is a laser.

5. The method according to claim 1 wherein the assembly further comprises an organic light emitting diode device disposed between the substrates.

6. The method according to claim 1 wherein the force is applied by a plurality of gas jets directed against the assembly.

7. The method according to claim 1 wherein the force is applied by a gas discharged from a porous member.

8. The method according to claim 7 wherein the porous member is annular.

* * * * *

UNITED STATES PATENT AND TRADEMARK OFFICE
CERTIFICATE OF CORRECTION

PATENT NO. : 7,918,954 B2
APPLICATION NO. : 12/245832
DATED : April 5, 2011
INVENTOR(S) : Amsden et al.

It is certified that error appears in the above-identified patent and that said Letters Patent is hereby corrected as shown below:

| No. | Col. | Line | Description |
|---|---|---|---|
| 1 | 10 | 37 | Please delete "fit" and add --frit-- |
| 2 | 10 | 38 | Please delete "fit" and add --frit-- |

Signed and Sealed this
Twelfth Day of July, 2011

David J. Kappos
*Director of the United States Patent and Trademark Office*